US007970154B2

(12) United States Patent
Akino

(10) Patent No.: US 7,970,154 B2
(45) Date of Patent: Jun. 28, 2011

(54) CONDENSER MICROPHONE

(75) Inventor: Hiroshi Akino, Machida (JP)

(73) Assignee: Kabushiki Kaisha Audio-Technica, Tokyo (JP)

( * ) Notice: Subject to any disclaimer, the term of this patent is extended or adjusted under 35 U.S.C. 154(b) by 1147 days.

(21) Appl. No.: 11/473,182

(22) Filed: Jun. 23, 2006

(65) Prior Publication Data

US 2006/0291672 A1 Dec. 28, 2006

(30) Foreign Application Priority Data

Jun. 24, 2005 (JP) ................................. 2005-184512

(51) Int. Cl.
*H04R 3/00* (2006.01)
*H04R 25/00* (2006.01)
*H03F 99/00* (2009.01)
*H03F 3/04* (2009.01)

(52) U.S. Cl. ........ 381/113; 381/111; 381/174; 381/175; 381/120; 381/191; 330/296

(58) Field of Classification Search .................. 381/113, 381/174, 355; 363/21.01
See application file for complete search history.

(56) References Cited

U.S. PATENT DOCUMENTS 5,341,086 A * 8/1994 Fukudome .................... 323/273
2004/0196990 A1* 10/2004 Akino et al. .................. 381/174
2006/0198409 A1* 9/2006 Chen .......................... 372/38.09

FOREIGN PATENT DOCUMENTS

JP 6-52300 U 7/1994
JP 9-83274 3/1997
JP 9-83463 A 3/1997
JP 2001-352596 A 12/2001

OTHER PUBLICATIONS

Yoshio Kikuchi, Control circuit of Microphone power source, Jul. 15, 1994. Translation of JP 06-052300.*

* cited by examiner

*Primary Examiner* — Curtis Kuntz
*Assistant Examiner* — Sunita Joshi
(74) *Attorney, Agent, or Firm* — Oblon, Spivak, McClelland, Maier & Neustadt, L.L.P.

(57) ABSTRACT

A condenser microphone is obtained, in which the bias of a current amplifier circuit in emitter-follower connection immediately after an impedance converter automatically changes in accordance with the switching of phantom power supply voltages and the maximum output level and the maximum permissible input sound pressure level are increased at any power supply voltage. The condenser microphone comprising a transistor Q2 in emitter-follower connection immediately after an FET 2 that constitutes an impedance converter Q1 has a constant current diode D2 connected to an output transformer TRS that also serves as a transformer for phantom power source supply and resistors R0 and R1 that divide the voltage on the cathode side of the constant current diode D2 into a bias voltage that causes the transistor Q2 to operate.

5 Claims, 9 Drawing Sheets

(RELATED ART)

(RELATED ART)

(RELATED ART)

(RELATED ART)

(RELATED ART)

(RELATED ART)

CONDENSER MICROPHONE

BACKGROUND OF THE INVENTION

1. Field of the Invention

The present invention is related to a condenser microphone that uses an impedance converter in which a bias diode and resistor are incorporated and, more particularly, is characterized by a current amplifier circuit connected immediately after the impedance converter.

2. Related Background of the Invention

Since the output impedance of a microphone unit of a condenser microphone is high, impedance conversion is performed for output by an impedance converter configured mainly by a field effect transistor (hereinafter, referred to as an "FET"). In some cases, the FET constituting an impedance converter incorporates a bias diode and resistor and in other cases not. A circuit part such as a resistor and diode for applying a bias is indispensable for operating an FET. Therefore, that an FET does not incorporate a bias diode and resistor does not mean that a bias diode and resistor are integrally incorporated with an FET but means that a bias diode and resistor are provided in a form of being externally attached to an FET. When it is necessary for a compact microphone such as a tiepin type microphone to incorporate an impedance converter in a microphone unit section, if an FET is a type that does not incorporate a bias part, a bias part needs to be externally attached to the FET and there arises a problem that the microphone unit section becomes bulky. Therefore, in a compact microphone such as a tiepin type microphone, an impedance converter configured by an FET of type that incorporates a bias resistor and diode is used.

FIG. 3 shows a circuit example of a conventional condenser microphone of type in which an FET does not incorporate a bias part. In FIG. 3, the portion on the left side from line A-A is a microphone head section and the microphone head section comprises an electret condenser microphone unit 1, an impedance converter configured mainly by an FET 2 and converting the impedance of the output from the microphone unit 1, and a bias circuit 3 consisting of resistors, a condenser, and diodes that apply a bias to the FET 2. Symbol 5 denotes a ground line connected to a shield line of a microphone cable and symbols 6 and 7 denote balanced output lines and each of the lines also functions as a phantom power supply line.

FIG. 4 is a graph showing the result of measurement of the relationship between the input level (dBV) and the distortion ratio (%) of the output signal in the conventional example shown in FIG. 3. As for the voltage of the phantom power supply to be supplied to the condenser microphone, the three kinds of voltage, that is, 12 V, 24 V, and 48 V, are specified by RC-8162A (power supply system of a microphone) of the Standard of Electronic Industries Association of Japan (EIAJ), therefore, the respective power supply voltages were supplied and measurement was carried out for the respective voltages. Each of curves P12, P24, and P48 in FIG. 4 shows each result of the measurement carried out at the voltages 12V, 24V, and 48V. As the input level increases, the distortion ratio increases. The input level at a distortion ratio of 1% is 6.12 dBV for a power supply voltage of 12 V, 17.1 dBV for a power supply voltage of 24 V, and not measurable for a power supply voltage of 48 V. In the conventional example shown in FIG. 3, the constant of the bias circuit of the FET 2 is set fixedly, therefore, it is impossible to obtain excellent distortion ratio curves for all of the power supply voltages and in the results shown in FIG. 4, a power supply voltage of as high as 48 V cannot be coped with.

On the other hand, also in the conventional condenser microphone equipped with an FET of type that incorporates a bias resistor and diode as an impedance converter, the bias voltage is fixed by the circuit constant within the FET, therefore, it is impossible to change a drain current. Because of this, it is difficult to operate properly across the entire range of power supply voltage from 12 V to 48 V. In view of this, a condenser microphone equipped with an FET of type that incorporates a bias resistor and diode for proper operation even at 48 V, which is the maximum voltage of a phantom power supply, as shown in FIG. 5.

In FIG. 5, symbol Q1 denotes an impedance converter equipped with an FET that incorporates bias resistor and diodes. Symbol Q2 denotes a transistor connected immediately after the impedance converter Q1 and the transistor Q2 constitutes an emitter follower current amplifier circuit. C1 denotes a capacitor that constitutes the bias circuit of the transistor Q2, R1, R2, and R3 denote resistors that constitute the bias circuit of the transistor Q2, and D2 denotes a constant current diode, respectively.

As described above, the EIAJ standard relating to the power supply system of a microphone specifies the three kinds of phantom power supply voltage and their permissible ranges are specified as 12±1 V, 24±4 V, and 48±4 V, respectively. Therefore, the minimum voltage and the maximum voltage that define the permissible range are 11 V and 52 V, respectively and it is desired for a microphone to operate normally in this range of voltage. In order for a microphone to operate in the above-mentioned range of voltage, priority is given generally in designing a microphone so as to operate at a minimum voltage of 11 V. Because of this, a drawback is presented that the maximum output voltage is kept low. On the other hand, if design is made so that the maximum output voltage is obtained at a power supply voltage of 48 V, another drawback is presented that operation is terminated if a voltage of 12 V or 24 V is connected to the phantom power source.

FIG. 6 shows the result of measurement of the relationship between the input level (dBV) and the distortion ratio (%) of the output signal in the conventional example shown in FIG. 5. If design is made so as to operate at a phantom power supply voltage of 48 V, the maximum output voltage when operation is effected at a power supply voltage of 48 V is 15.3 V and the maximum permissible input sound pressure level when sensitivity is set to −40 dBV/Pa is 149.3 dBSPL. When operation is effected at a power supply voltage of 24 V, the maximum output level is 1.8 dBV and the maximum permissible input sound pressure level when sensitivity is set to −40 dBV/Pa is 142.3 dBSPL. No operation was effected at a power supply voltage of 12 V.

The inventors of the present invention have developed a condenser microphone capable of solving the problems of the conventional technique as described above and filed for patent application formerly (refer to Japanese Patent Application No. 2005-177542). Examples shown in FIG. 7 and FIG. 8 show the examples of a condenser microphone in accordance with the same technical idea as that of the invention relating to the above-mentioned patent application. In these examples, a bias of the transistor Q2 constituting the emitter follower current amplifier circuit connected immediately after the impedance converter Q1 including an FET that incorporates a bias resistor and diodes is applied by a forward voltage of a diode D3. C1 denotes the bias capacitor of the transistor Q2 and R1 and R2 denote the bias resistors of the transistor Q2. Other circuit configuration is the same as that shown in FIG. 5. The forward voltage that appears between terminals of the diode D3 remains substantially constant even if the power supply voltage changes, therefore, the bias of the transistor Q2 remains substantially constant when the power supply voltage changes. The circuit example in FIG. 8 differs from the circuit example in FIG. 7 in that the microphone head section including the condenser microphone unit 1 and the impedance converter Q1 and the power module section including the emitter follower transistor Q2 are separated and the microphone head section and the power module section are connected by a dedicated extension cord. In FIG. 8, the extension cord is shown as three lines in parallel to each another. Further, capacitors for blocking a high-frequency current caused by electromagnetic waves from invading the extension cord are incorporated in the microphone head section and the power module section and inductors are further incorporated in the power module section.

FIG. 9 shows the result of measurement of the relationship between the input level (dBV) and the distortion ratio (%) of the output signal in the conventional example shown in FIG. 7. Operation is effected normally at a phantom power supply voltage of 12 V, 24 V, or 48 V. The maximum output voltage (the voltage at a distortion ratio of 1% ) when operation is effected at a power supply voltage 48 V is 15.3 V and the maximum permissible input sound pressure level when sensitivity is set to −40 dBV/Pa is 149.3 dBSPL. When operation is effected at a power supply voltage of 24 V, the maximum output level is 8.3 dBV and the maximum permissible input sound pressure level when sensitivity is set to −40 dBV/Pa is 142.3 dBSPL. When operation is effected at a power supply voltage of 12 V, the maximum output level is −2.0 dBV and the maximum permissible input sound pressure level when sensitivity is set to −40 dBV/Pa is 132.0 dBSPL.

As shown in the example in FIG. 8, however, if the microphone head section and the power module section are connected by a dedicated extension cord, and capacitors and inductors for blocking a high-frequency current that invades the extension cord are incorporated in the power module, a drawback is presented that the bias of the emitter follower transistor Q2 changes and the operation of the transistor Q2 becomes unstable. In particular, when the extension cord is lengthened, there may be the case where the transistor Q2 operates no longer. Therefore, a condenser microphone of type in which the bias of the transistor Q2 by emitter follower connection to be connected immediately after the impedance converter Q1 including an FET is applied by a forward voltage of a diode is suitable to a microphone of type in which the microphone head section and the power module section are directly connected and not extended by a dedicated cord as shown in the example in FIG. 7.

When extension by a dedicated cord is made, it is necessary to devise so that the bias voltage of the emitter follower transistor Q2 changes when the phantom power supply voltage is switched to another in the power module.

Incidentally, investigation of prior art relating to the application of the present invention resulted in finding no prior art closely relating to the application of the present invention. If obliged to refer to any technique, there is a signal processing device (refer to the patent document 1) having a configuration in which in order to avoid the influence of the click at the time of switching of the phantom power supplies, a microcomputer causes a mute circuit comprised of an analog/digital converter to operate to put the output from the analog/digital converter to zero for a predetermined period of time irrespective of the input signal when switched between power source supply to a microphone from the phantom power source and termination of supply.

The invention described in the patent document 1, however, is not one that devises the bias of the emitter follower circuit immediately after the FET that constitutes the impedance converter.

[Patent document 1] Japanese Unexamined Patent Application Publication No. Hei 9-83274

SUMMARY OF THE INVENTION

The present invention has been developed in view of the problems of the conventional condenser microphone, and an object thereof is to provide a condenser microphone that operates normally even if the voltage of the phantom power source is switched to any voltage and the maximum output level and the maximum permissible input sound pressure level of which are higher than before because the bias of a current amplifier circuit by emitter follower connection immediately after an impedance converter automatically changes in accordance with the switching of the phantom power supply voltages.

The present invention is most characterized in that a condenser microphone comprising a transistor in emitter-follower connection immediately after an FET constituting an impedance converter has a constant current diode connected to an output transformer that also serves as a transformer for phantom power supply and resistors that divide the voltage on the cathode side of the constant current diode into a bias voltage that operates the above-mentioned transistor.

Even if the phantom power supply voltage is switched to another, the current that flows through the constant current diode remains substantially constant and the voltage on the cathode side of the constant current diode changes in accordance with the switching of the phantom power supply voltages. Since the voltage on the cathode side of the constant current diode is divided by the resistors into a bias for the transistor in emitter-follower connection, the bias of the above-mentioned transistor changes in accordance with the switching of the phantom power supply voltages and the transistor is guaranteed to operate suitably by the suitable bias in accordance with the phantom power supply voltage. As a result, a normal operation is effected at any phantom power supply voltage and the maximum output level and the maximum permissible input sound pressure level can be increased than before.

DESCRIPTION OF THE PREFERRED EMBODIMENTS

An embodiment of a condenser microphone according to the present invention is explained below with reference to FIG. 1 and FIG. 2.

Figure 1:
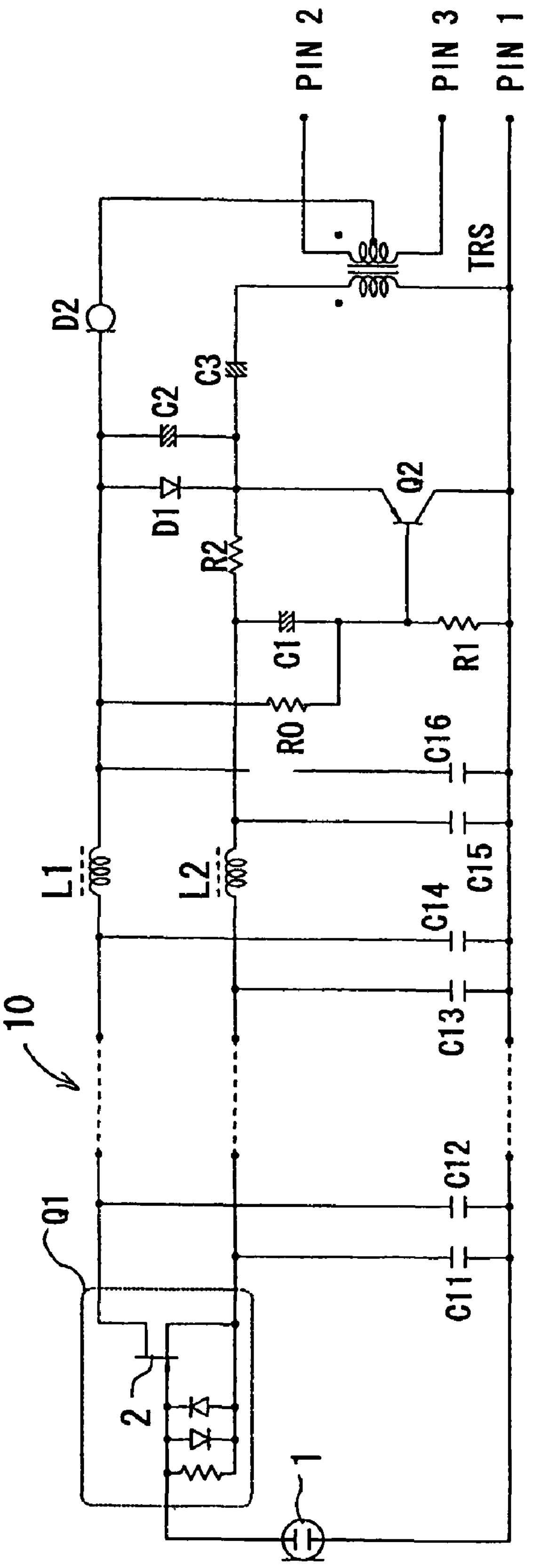
FIG. 1 is a circuit diagram showing an embodiment of a condenser microphone according to the present invention.

In FIG. 1, symbol 1 denotes an electret condenser microphone unit, one end of the microphone unit 1 is connected to an input end of an impedance converter Q1, and the other end is connected to the ground. The impedance converter Q1 is constituted mainly by an FET 2. The impedance converter Q1 is a type that incorporates bias circuit elements such as a resistor and a diode. The anode and cathode of the FET 2 constitute balanced output end and immediately after the balanced output end, a transistor Q2 as a current amplifier circuit in emitter-follower connection is connected. In the example shown in FIG. 1, however, the configuration is such that a microphone head section consisting of the microphone unit 1 and the impedance converter Q1 and a power module section including the transistor Q2, an output transformer TRS, etc., are separated and connected by a dedicated extension cord 10.

The output transformer TRS has a primary coil and a secondary coil with center tap and one end of the primary coil is connected to the emitter of the transistor Q2 of PNP type via a capacitor C3 and the other end of the primary coil is grounded. Both ends of the secondary coil of the output transformer TRS are connected to a second pin and a third pin of a standardized three-pin connecter, respectively, and a first pin is grounded. A microphone output is taken out from the three-pin connector. The center tap of the secondary coil is designed so as to connect to one of the balanced output lines of the extension cord 10 via a constant current diode D2 in the forward direction. The cathode side of the constant current diode D2 is connected to the emitter of the transistor Q2 via the parallel connection of a capacitor C1 and a diode D1 and at the same time, is connected to the base of the transistor Q2 via a resistor R0. The base of the transistor Q2 is connected to the ground via a resistor R1. Therefore, the resistors R0 and R1 serve as voltage dividing resistors that divide the voltage on the cathode side of the constant current diode D2 and the divided voltage is applied to the base of the transistor Q2 as a bias voltage. The emitter of the transistor Q2 is designed so as to connect to the other balanced output line of the extension cord 10 via a resistor R2 and also connect to the base of the transistor Q2 via the resistor R2 and the capacitor C1. The collector of the transistor Q is connected to the ground.

Between the center tap of the secondary coil of the output transformer TRS and the ground, a phantom power source is connected and a power source is supplied to the power module section and the microphone head section to drive each section. As described above, the voltage of the phantom power source is standardized to 12 V, 24 V, and 48 V and any one of the voltages is used. Therefore, there may be the case where the phantom power supply voltage is switched to another. Even if the phantom power supply voltage is switched to another, the current that flows through the constant current diode D2 remains substantially constant and the voltage on the cathode side of the constant current diode D2 changes in accordance with the switching of the phantom power supply voltages. The voltage on the cathode side of the constant current diode D2 is divided by the voltage dividing resistors R0 and R1 and used as a bias of the transistor Q2 in emitter-follower connection, therefore, the bias of the transistor Q2 changes in accordance with the switching of the phantom power supply voltages and the transistor Q2 is guaranteed to operate suitably by a suitable bias in accordance with the phantom power supply voltage.

In the circuit example shown in FIG. 1, the power module section and the microphone head section are connected by the extension cord 10, therefore, electromagnetic waves are likely to invade the extension cord 10 and if electromagnetic waves invade, a high-frequency current flows to become a noise. In view of this, capacitors and inductors to prevent a high-frequency current from invading the power module section are connected. The capacitors to prevent a high-frequency current from invading include capacitors C11 and C12 connected between the balanced output lines and the ground in the microphone head section and capacitors C13 and C14 connected between the balanced output lines and the ground in the power module section. Further, in the power module section, other capacitors C15 and C16 are connected in parallel with the capacitors C13 and C14, an inductor L1 is connected in series between the capacitors C14 and C16, and an inductor L2 is connected in series between the capacitors C13 and C15. The extension cord 10 has the two balanced output lines and a shield line that connects the ground of the power module section to that of the microphone head section. The shield line covers the two balanced output lines from the outside for shielding.

According to the embodiment shown in FIG. 1, as described above, the bias of the transistor Q2 changes in accordance with the switching of the phantom power supply voltages and the transistor Q2 is guaranteed to operate suitably by the suitable bias in accordance with the phantom power supply voltage. The bias voltage for operating the transistor Q2 in emitter-follower connection is kept suitable within the power module section, therefore, even if the dedicated extension cord 10 is interposed between the power module section and the microphone head section, the transistor Q2 in emitter-follower connection operates stably. Further, as in the example shown in FIG. 1, even if the capacitors and the inductors for preventing a high-frequency current from invading the power module section are connected, the transistor Q2 in emitter-follower connection operates stably.

Figure 2:
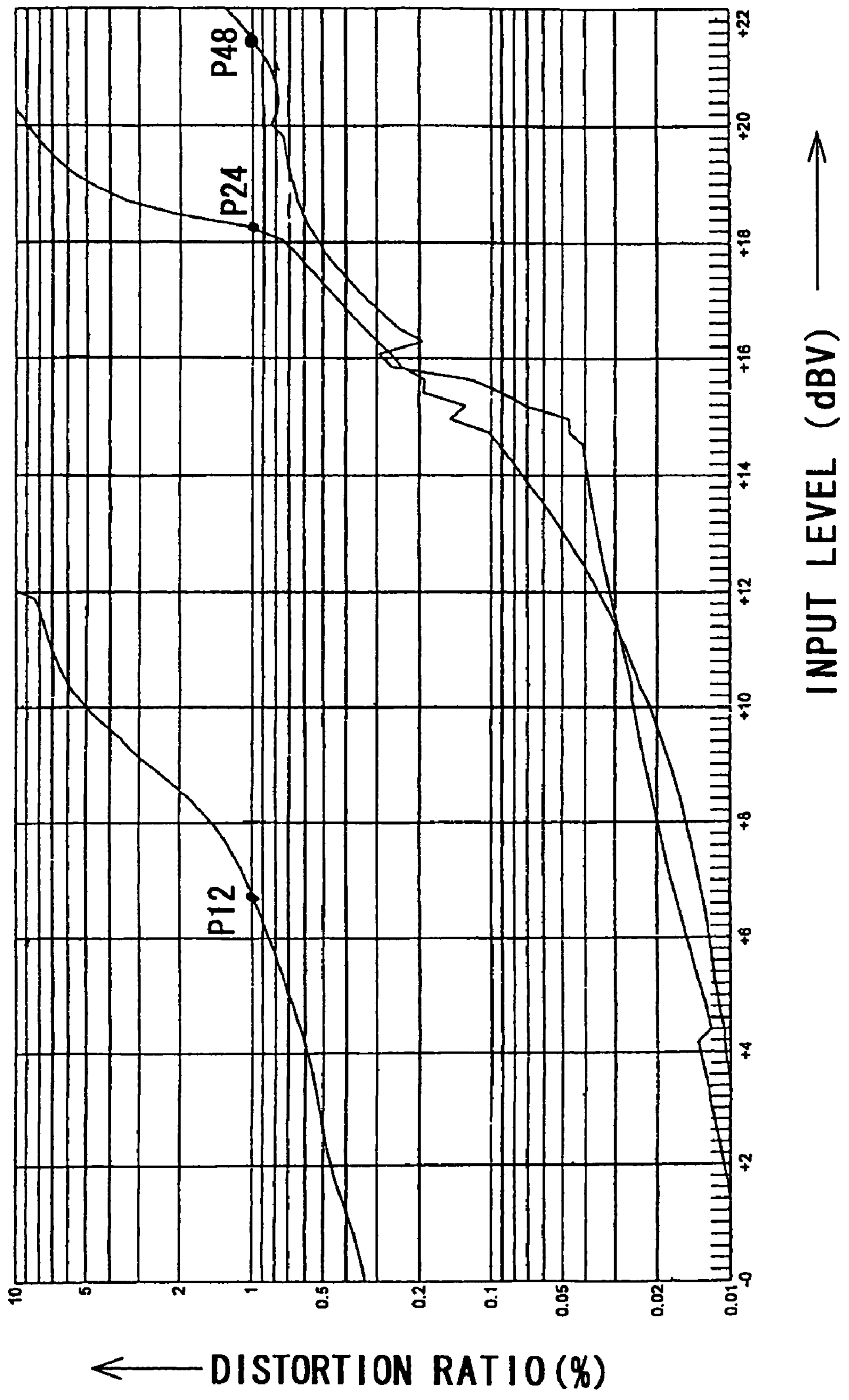
FIG. 2 is a graph showing the result of measurement of the performance of the embodiment.
Figure 3:
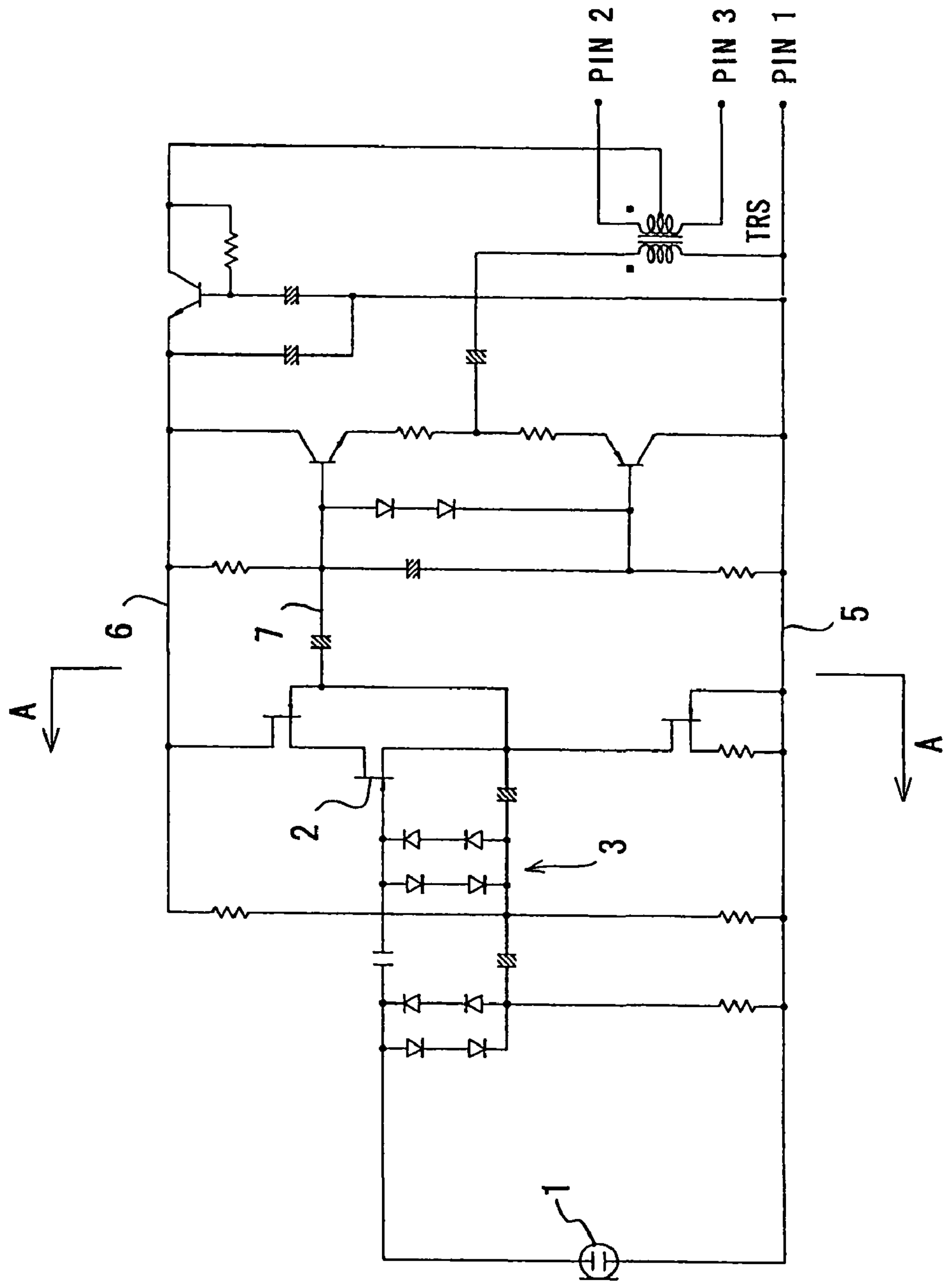
FIG. 3 is a circuit diagram showing a conventional example of a condenser microphone.
Figure 4:
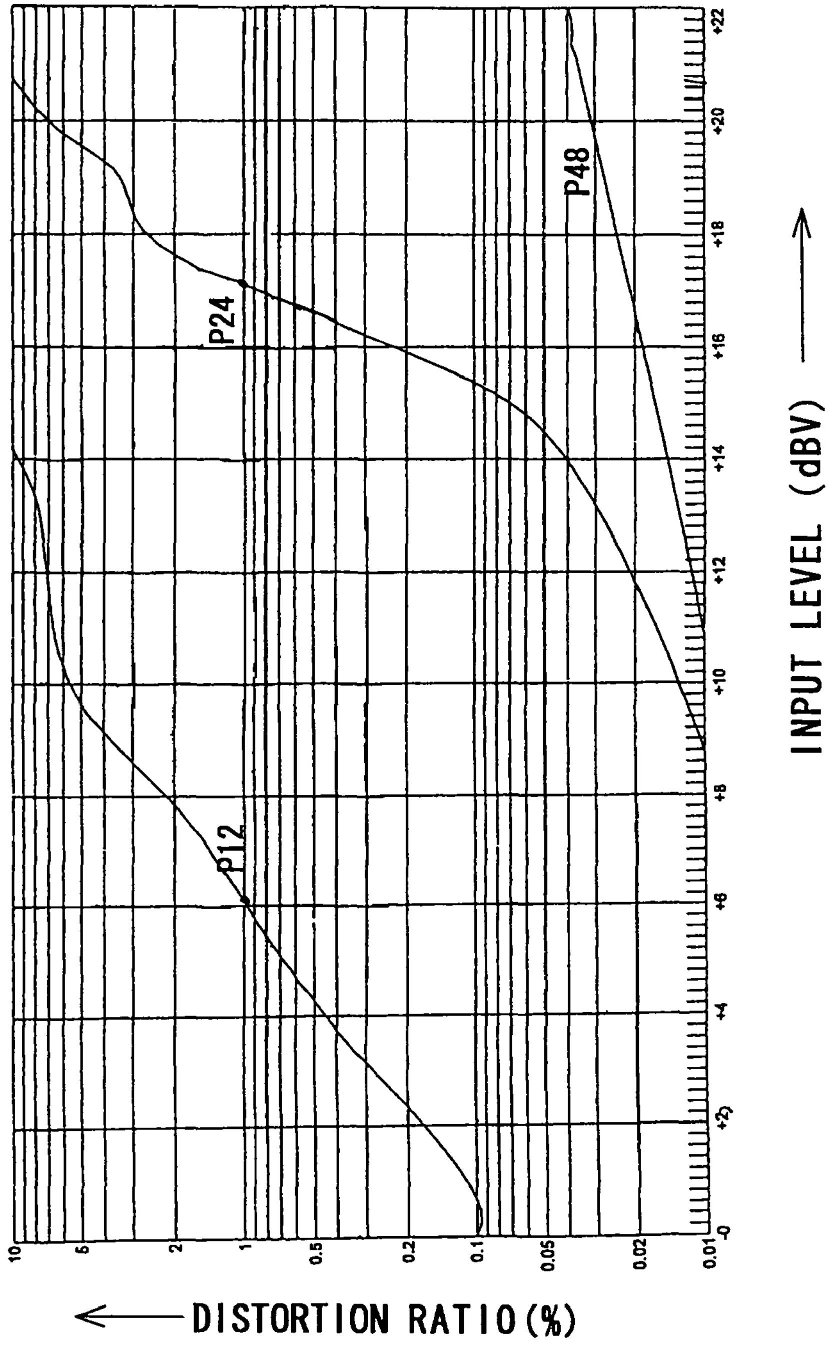
FIG. 4 is a graph showing the result of measurement of the performance of the conventional example.
Figure 5:
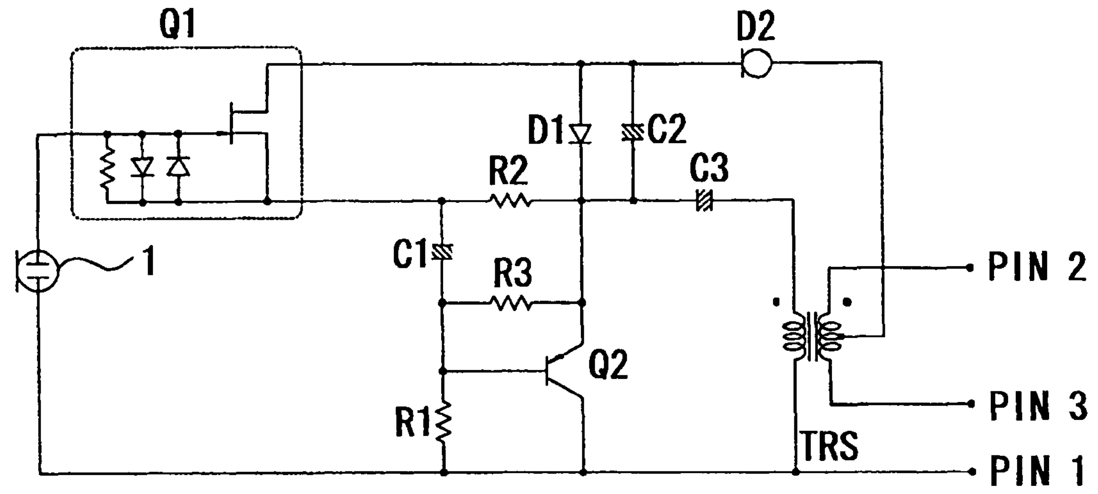
FIG. 5 is a circuit diagram showing another example of a conventional condenser microphone.
Figure 6:
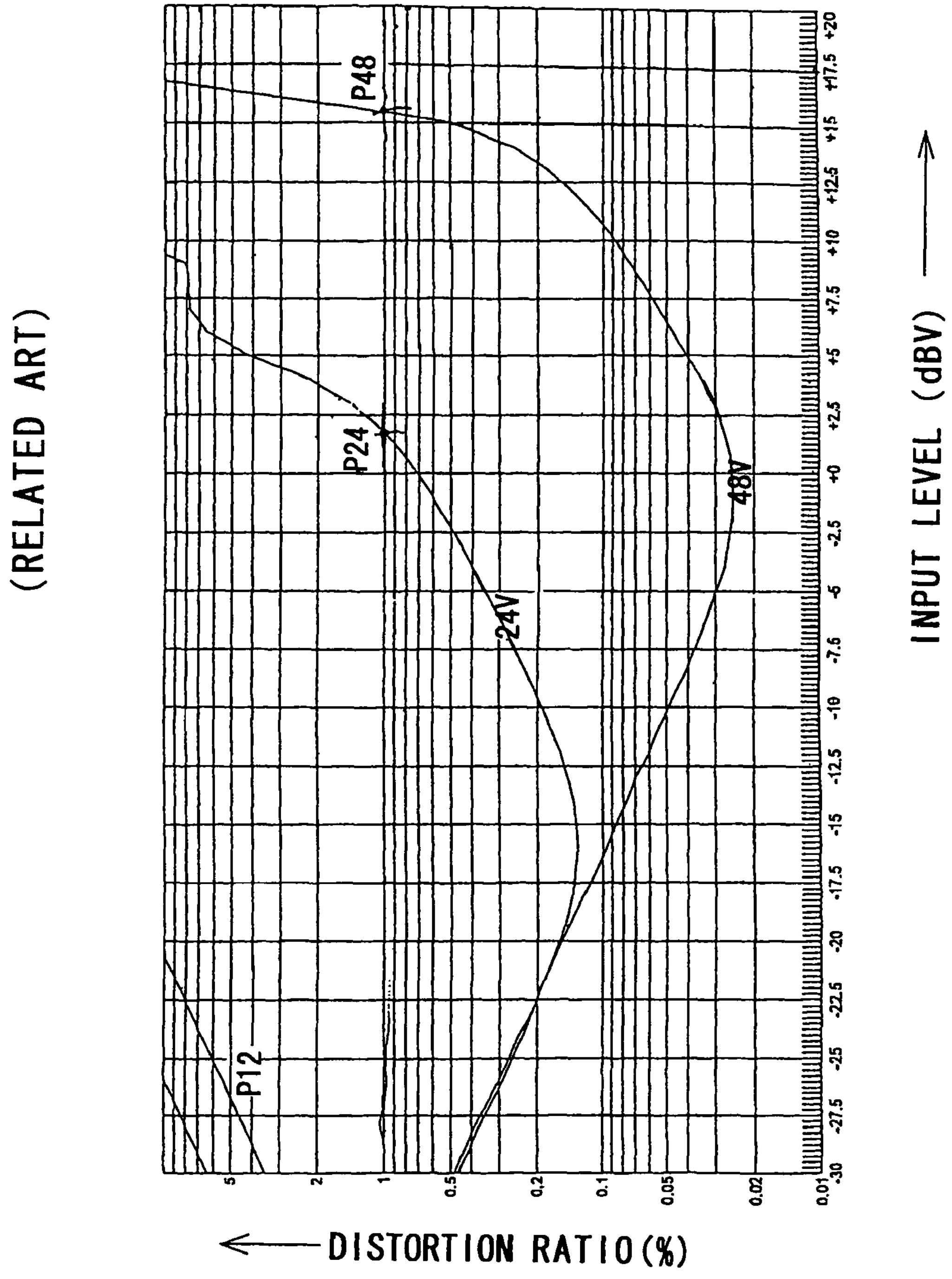
FIG. 6 is a graph showing the result of measurement of the performance of the conventional example.
Figure 7:
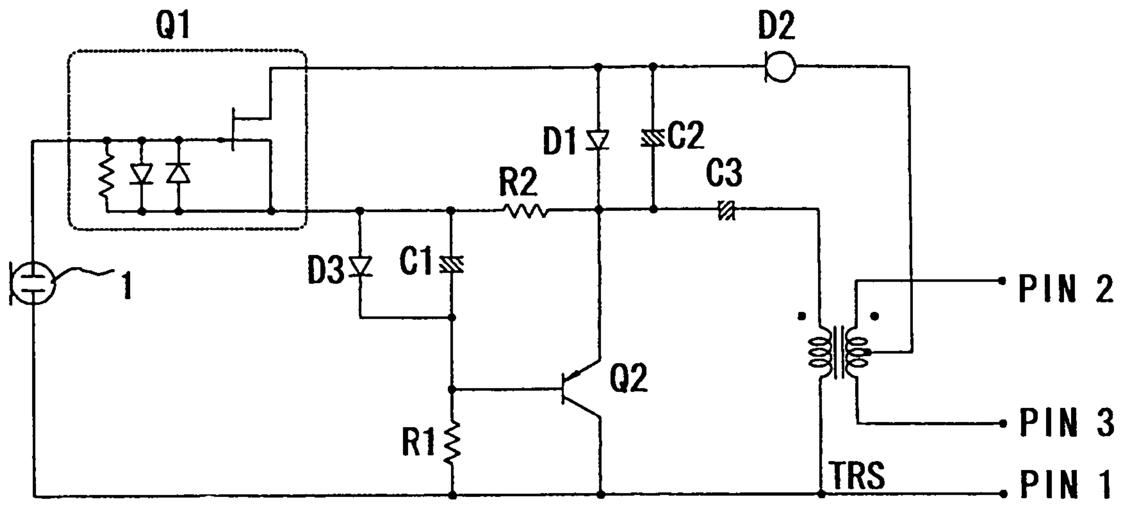
FIG. 7 is a circuit diagram showing an example of a condenser microphone proposed by the inventors of the present invention formerly.
Figure 8:
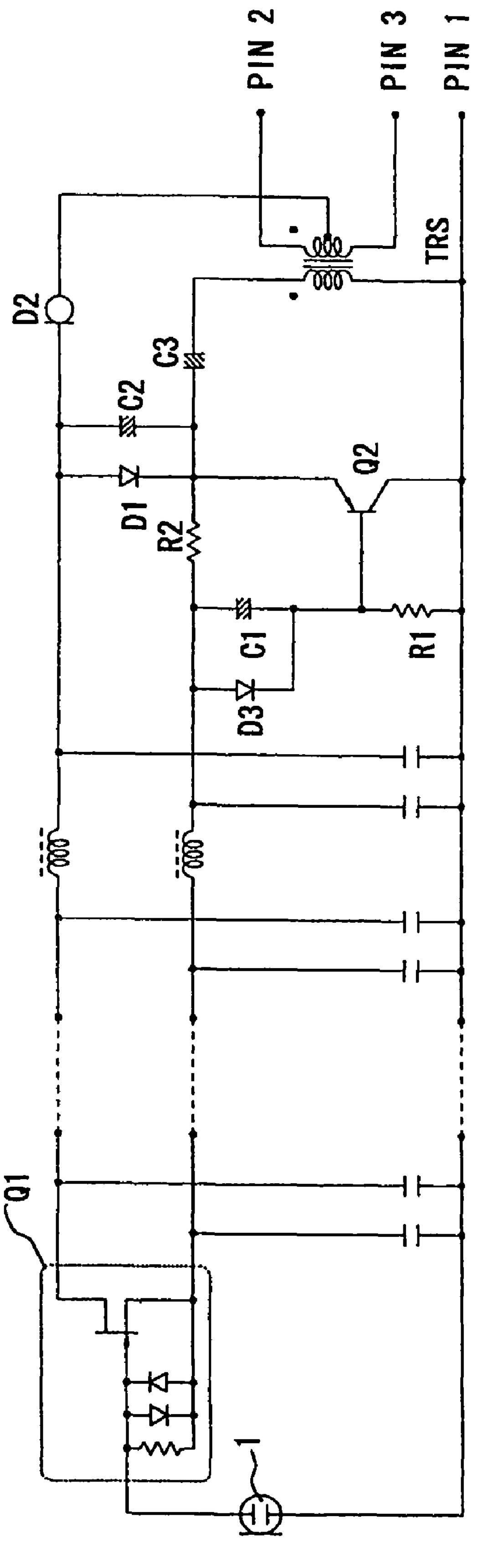
FIG. 8 is a circuit diagram showing the example of the condenser microphone proposed by the inventors of the present invention formerly, in which a microphone head section and a power module section are connected by an extension cord.
Figure 9:
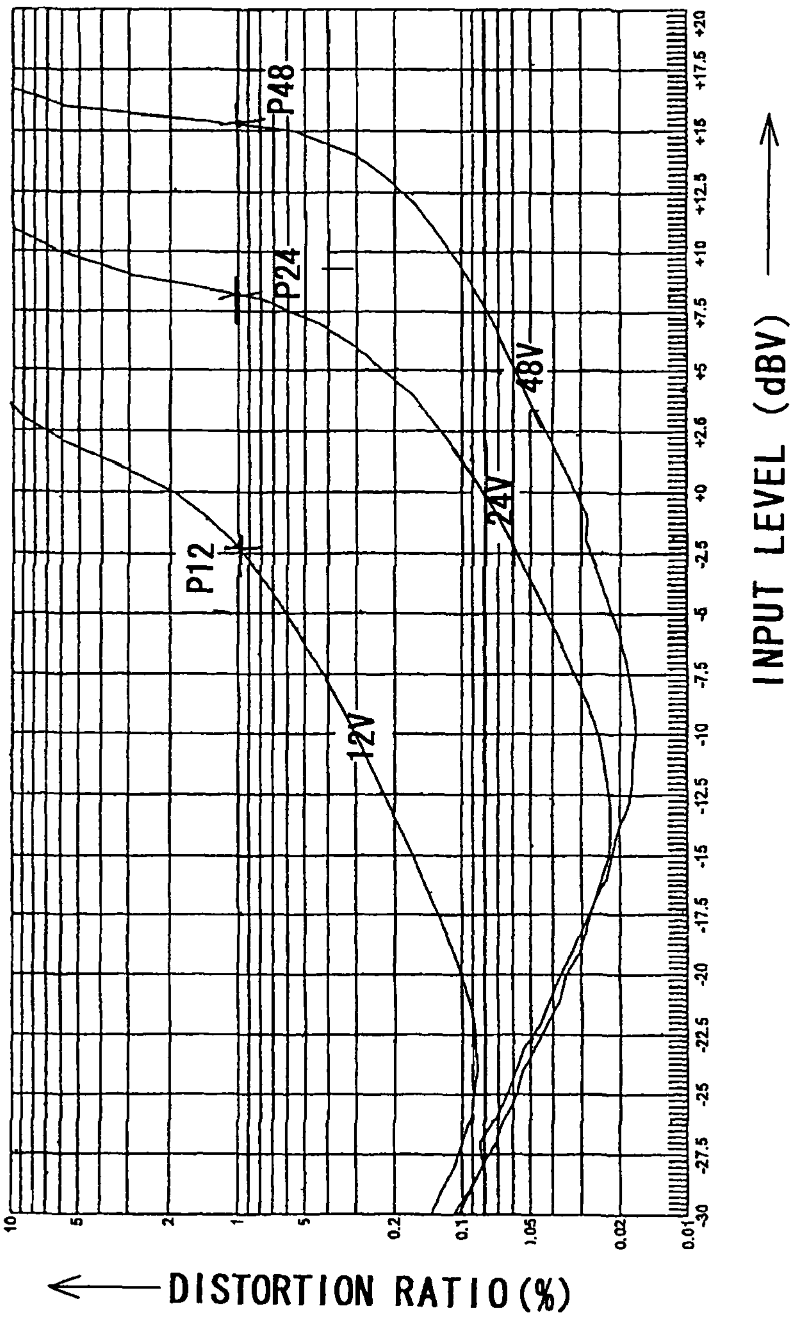
FIG. 9 is a graph showing the result of measurement of the performance of the condenser microphone proposed by the inventors of the present invention formerly.

FIG. 2 shows the result of measurement of the relationship between the input level (dBV) and the distortion ratio (%) of the output signal in the embodiment shown in FIG. 1. The graph P12 shows the case of operation at a power supply voltage of 12 V, the graph P24 shows the case of operation at a power supply voltage of 24 V, and the graph P48 shows the case of operation at a power supply voltage of 48 V. In any case, measurement was made using an audio signal of 1 KHz. The maximum output voltage in the case of operation at a power supply voltage of 48 V is 21.4 V and the maximum permissible input sound pressure level when sensitivity is set to −40 dBV/Pa is 155.4 dBSPL. The maximum output level in the case of operation at a power supply voltage of 24 V is 18.3 dBV and the maximum permissible input sound pressure level when sensitivity is set to −40 dBV/Pa is 152.3 dBSPL. The maximum output level in the case of operation at a power supply voltage of 12 V is 6.7 dBV and the maximum permissible input sound pressure level when sensitivity is set to −40 dBV/Pa is 140.7 dBSPL. As can be seen from the measurement result, at any power supply voltage, the transistor Q2 in emitter-follower connection operates stably and both the maximum output level and the maximum permissible input sound pressure level at each power supply voltage are increased than before.

The above-mentioned measurement result shows that the type in which the bias diode and resistor is not incorporated but externally attached to the FET has the equivalent maximum output level as that of the circuit in which the suitable bias is given to the transistor in emitter-follower connection. Incidentally, the measurement result when the bias diode and resistor is externally attached to the FET and the suitable bias is given is shown as follows. The maximum output voltage in the case of operation at a power supply voltage of 48 V is 22.4 V and the maximum permissible input sound pressure level when sensitivity is set to −40 dBV/Pa is 156.4 dBSPL. The maximum output level in the case of operation at a power supply voltage of 24 V is 17.1 dBV and the maximum permissible input sound pressure level when sensitivity is set to −40 dBV/Pa is 151.1 dBSPL. The maximum output level in the case of operation at a power supply voltage of 12 V is 6.1 dBV and the maximum permissible input sound pressure level when sensitivity is set to −40 dBV/Pa is 140.1 dBSPL.

What is claimed is:

1. A condenser microphone comprising:

a transistor in emitter-follower connection immediately after an FET that constitutes an impedance converter;

a constant current diode connected to an output transformer that also serves as a transformer for a phantom power source supply; and resistors that divide the voltage on the cathode side of the constant current diode into a bias voltage that causes the transistor to operate, wherein the first end of the resistors is directly connected to the cathode side of the constant current diode and a second end of the one of the resistors is connected to a base of the transistor; and the bias of the transistor changes in accordance with switching of a phantom power supply voltage from the phantom power source supply.

2. The condenser microphone according to claim 1, wherein a microphone head section that includes the impedance converter and a power module section that includes the transistor in emitter-follower connection are separated and connected by a cord.

3. The condenser microphone according to claim 2, wherein a capacitor for preventing a high-frequency current from invading is connected in the power module section.

4. The condenser microphone according to claim 2, wherein an inductor for preventing a high-frequency current from invading is connected in the power module section.

5. The condenser microphone according to claim 1, wherein the impedance converter is a type that incorporates a bias circuit element.

* * * * *